(12) United States Patent
Periyannan et al.

(10) Patent No.: US 10,141,064 B1
(45) Date of Patent: Nov. 27, 2018

(54) PREVENTION OF NEIGHBORING PLANE DISTURB IN NON-VOLATILE MEMORY

(71) Applicant: SANDISK TECHNOLOGIES LLC, Plano, TX (US)

(72) Inventors: Kirubakaran Periyannan, Santa Clara, CA (US); Daniel Joseph Linnen, Naperville, IL (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/585,680

(22) Filed: May 3, 2017

(51) Int. Cl.
| | |
|---|---|
| *G11C 16/24* | (2006.01) |
| *G11C 16/10* | (2006.01) |
| *G11C 16/26* | (2006.01) |
| *G11C 16/34* | (2006.01) |
| *G11C 16/30* | (2006.01) |
| *G11C 16/08* | (2006.01) |
| *G11C 16/14* | (2006.01) |

(52) U.S. Cl.
CPC .......... *G11C 16/3427* (2013.01); *G11C 16/08* (2013.01); *G11C 16/14* (2013.01); *G11C 16/24* (2013.01); *G11C 16/26* (2013.01); *G11C 16/30* (2013.01); *G11C 16/3459* (2013.01)

(58) Field of Classification Search
CPC .......... G11C 16/24; G11C 16/10; G11C 16/26
USPC ................................ 365/185.25, 185.11, 226
See application file for complete search history.

(56) References Cited

U.S. PATENT DOCUMENTS

| | | | | |
|---|---|---|---|---|
| 5,793,679 A | * | 8/1998 | Caser ..................... | G11C 16/12 365/185.27 |
| 2014/0084936 A1 | | 3/2014 | Pan | |
| 2016/0111954 A1 | * | 4/2016 | Bach ....................... | H04R 3/00 381/113 |

* cited by examiner

*Primary Examiner* — Jason Lappas
(74) *Attorney, Agent, or Firm* — Vierra Magen Marcus LLP

(57) ABSTRACT

Techniques are presented for the prevention and detection of inter-plane disturbs in a memory circuit, where, when concurrently performing memory operations on multiple planes, a defect in one plane can feed back through a common supply node and adversely affect memory operations in another node. To isolate such defects to plane in which the occur, the memory supplies the elements, such as a word line, of different planes from a common supply node through a uni-directional circuit element, such as a diode. In this way, if the voltage on an element in an array gets pulled up to an elevated voltage though a defect, this elevated voltage is stopped from flowing back to the common supply node. Additionally, by comparing the voltage levels on either side of the uni-directional circuit element, it can be determined whether such a defect is present in an array.

20 Claims, 9 Drawing Sheets

PREVENTION OF NEIGHBORING PLANE DISTURB IN NON-VOLATILE MEMORY

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer to create a vertical column of memory cells. A straight NAND string extends in one memory hole. Control gates of the memory cells are provided by the conductive layers.

Some non-volatile memory devices are used to store two ranges of charges and, therefore, the memory cell can be programmed/erased between two ranges of threshold voltages that correspond to two data states: an erased state (e.g., data "1") and a programmed state (e.g., data "0"). Such a device is referred to as a binary or two-state device.

A multi-state non-volatile memory is implemented by identifying multiple, distinct allowed ranges of threshold voltages. Each distinct range of threshold voltages corresponds to a data state assigned a predetermined value for the set of data bits. The specific relationship between the data programmed into the memory cell and the ranges of threshold voltages depends upon the data encoding scheme adopted for the memory cells. For example, U.S. Pat. No. 6,222,762 and U.S. Patent Application Publication No. 2004/0255090 both describe various data encoding schemes for multi-state flash memory cells.

Non-volatile memory devices can have defects, such as word lines or bit lines that leak to other elements of the array, and which can corrupt data stored on such devices. These defects can be present on a fresh device or occur over time as the device is operated, a situation that is often aggravated as devices shrink in scale and increase in complexity.

BRIEF DESCRIPTION OF THE DRAWINGS

Like-numbered elements refer to common components in the different figures.

DETAILED DESCRIPTION

Some non-volatile memory devices use a multi-plane structure, in which a chip has multiple independently accessible arrays or "planes", to increase storage density, improve efficiencies of operation, or both. Although the individual planes can typically be operated independently, they can also be operated in parallel to increase performance In such multi-plane operations, as the same operation is being performed concurrently on two or more planes, elements of these planes will be supplied concurrently from the same source. To take an example, when concurrently reading a word line from each of two planes, the selected word line in each plane will receive the same read voltage from a common node, such as the regulated output of a charge pump. As the two planes are connected through the common supply node, a disturb in the one array can be transmitted through the common node to the other array, causing a disturb there. Returning to the example of reading a word line in each of the arrays, if the read pass voltage on an adjacent word line pulls up the selected word line in one array, whether through leakage or capacitive coupling, this will feed back through the common node to the selected word line of the other array, raising up its read voltage and throwing off the read values in this other array.

To prevent such inter-plane disturb, the following introduces a unidirectional circuit element, such as a diode which can implemented as a diode connected transistor, between the common supply node and the elements being supplied. That way if, say, a word line voltage in the one plane is pulled up higher than the intended supply voltage, the problem will be isolated to the one array and not transmitted to the other array, whether the defect has been previously detected or not. To further add the ability to detect the defect, the voltage levels on either side of the unidirectional circuit element can be compared to see whether the voltage on the supplied element is the same as supply level voltage and, if not, take corrective measures.

Figure 1:
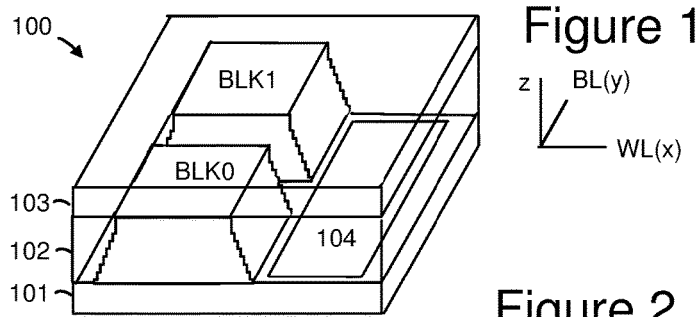
FIG. 1 is a perspective view of a 3D stacked non-volatile memory device.

To provide some context, FIG. 1 is a perspective view of a three dimensional (3D) stacked non-volatile memory device that can implement the technology proposed herein. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
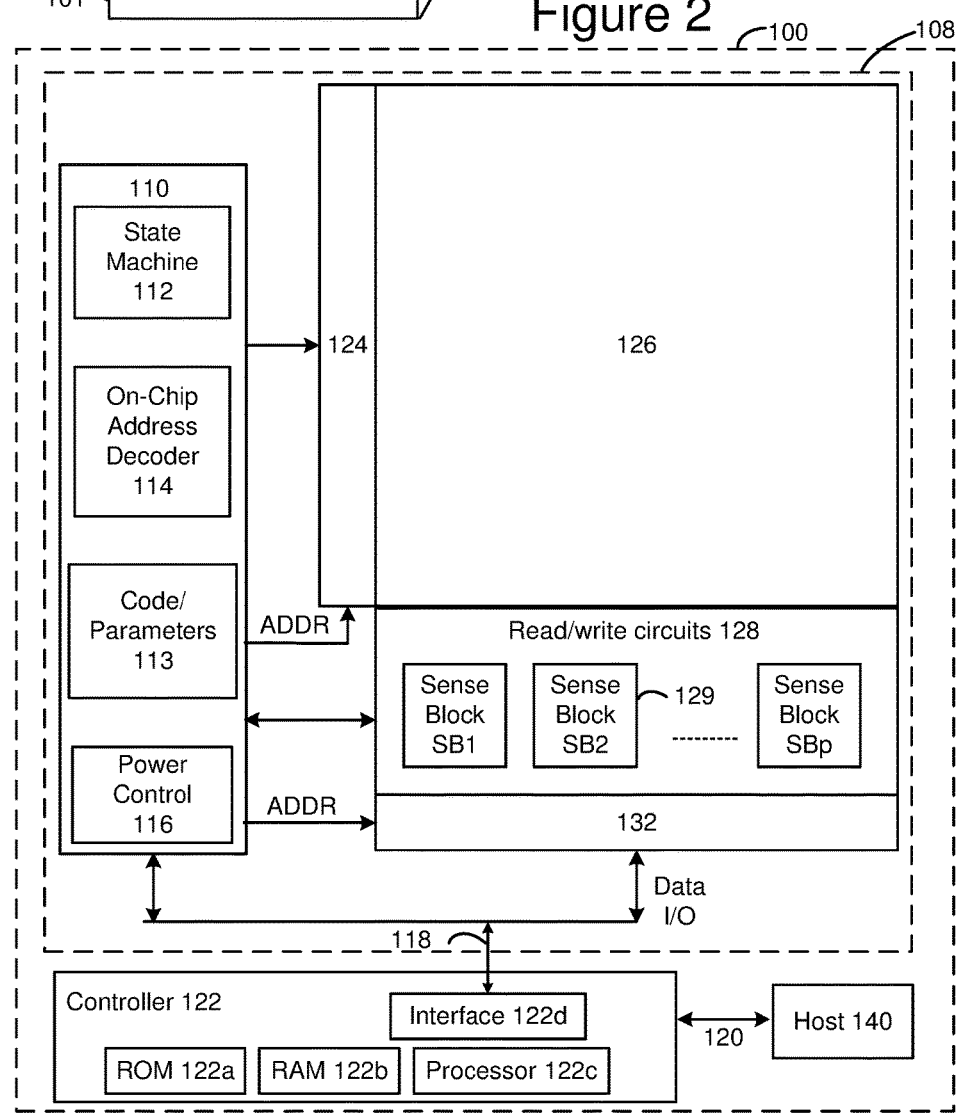
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks SB1, SB2, . . . , SBp 129 (sensing circuitry) and allow a page of memory cells to be read or programmed in parallel.

In some systems, a controller 122 is included in the same memory device 100 (e.g., a removable storage card) as the one or more memory die 108. However, in other systems, the controller can be separated from the memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electronic circuits).

The on-chip address decoder 114 provides an address interface between addresses used by host 140 or memory controller 122 to the hardware address used by the decoders 124 and 132. Power control module 116 controls the power and voltages supplied to the word lines and bit lines during memory operations. It can include drivers for word line layers (discussed below, whether in a 3D or 2D configuration), select transistors (e.g., SGS and SGD transistors, described below) and source lines. In particular, the power control module can include the word line drivers that serve as the biasing circuitry for the word lines in the various memory operations described below. Power control module 116 may include charge pumps for creating voltages. The sense blocks include bit line drivers, including the bit line drivers that serve as the biasing circuitry for the bit lines in the various memory operations described below. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks SB1, SB2, . . . , SBp, read/write circuits 128, and controller 122 may comprise a control circuit that performs the functions described herein.

The (on-chip or off-chip) controller 122 may comprise storage devices (such as ROM 122a and RAM 122b), a processor 122c and memory interface 122d. The storage devices store code such as a set of instructions, and the processor 122c is operable to execute the set of instructions to provide the functionality described herein. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between controller 122 and memory die 108. For example, memory interface 122d can change the format or timing of signals, provide a buffer, isolate from surges, latch I/O, etc.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors. A NAND flash memory array may be configured so that the array is composed of multiple NAND strings of which a NAND string is composed of multiple memory cells sharing a single bit line and accessed as a group. In one embodiment, NAND strings are grouped into blocks. Within a block, one end of each NAND string is connected to one of a plurality of bit lines and the other end of each NAND string is connected to a common source line for all NAND strings in the bock. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

The technology described herein can also be utilized with technologies in addition to the charge trapping and floating gate flash memory described above. In addition to flash memory (e.g., 2D and 3D NAND-type and NOR-type flash memory), examples of non-volatile memory include ReRAM memories, magnetoresistive memory (e.g., MRAM), and phase change memory (e.g., PCRAM).

One example of a ReRAM memory includes reversible resistance-switching elements arranged in cross point arrays accessed by X lines and Y lines (e.g., word lines and bit lines). Programming can be supplied by a series of voltage pulses (i.e. doses of programming) on the word lines. Memory cells can be inhibited by applying a large enough voltage on the corresponding bit lines to prevent a sufficient voltage differential across the memory cell.

In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature. Applying appropriate temperatures (over discrete periods of time—doses) can be used to program. Similarly, adjusting temperature can be used to inhibit. In some implementations, temperatures are controlled by applying voltages and/or currents to the memory cells and/or surrounding components.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created (i.e. the dose of programming). This approach requires a fairly substantial current to generate the field. Therefore, the programming is applied as a unit of current. Sufficiently reducing or removing the current can be used to inhibit programming.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that this technology is not limited to a single specific memory structure, but covers many relevant memory structures within the spirit and scope of the technology as described herein and as understood by one of ordinary skill in the art.

Figure 3:
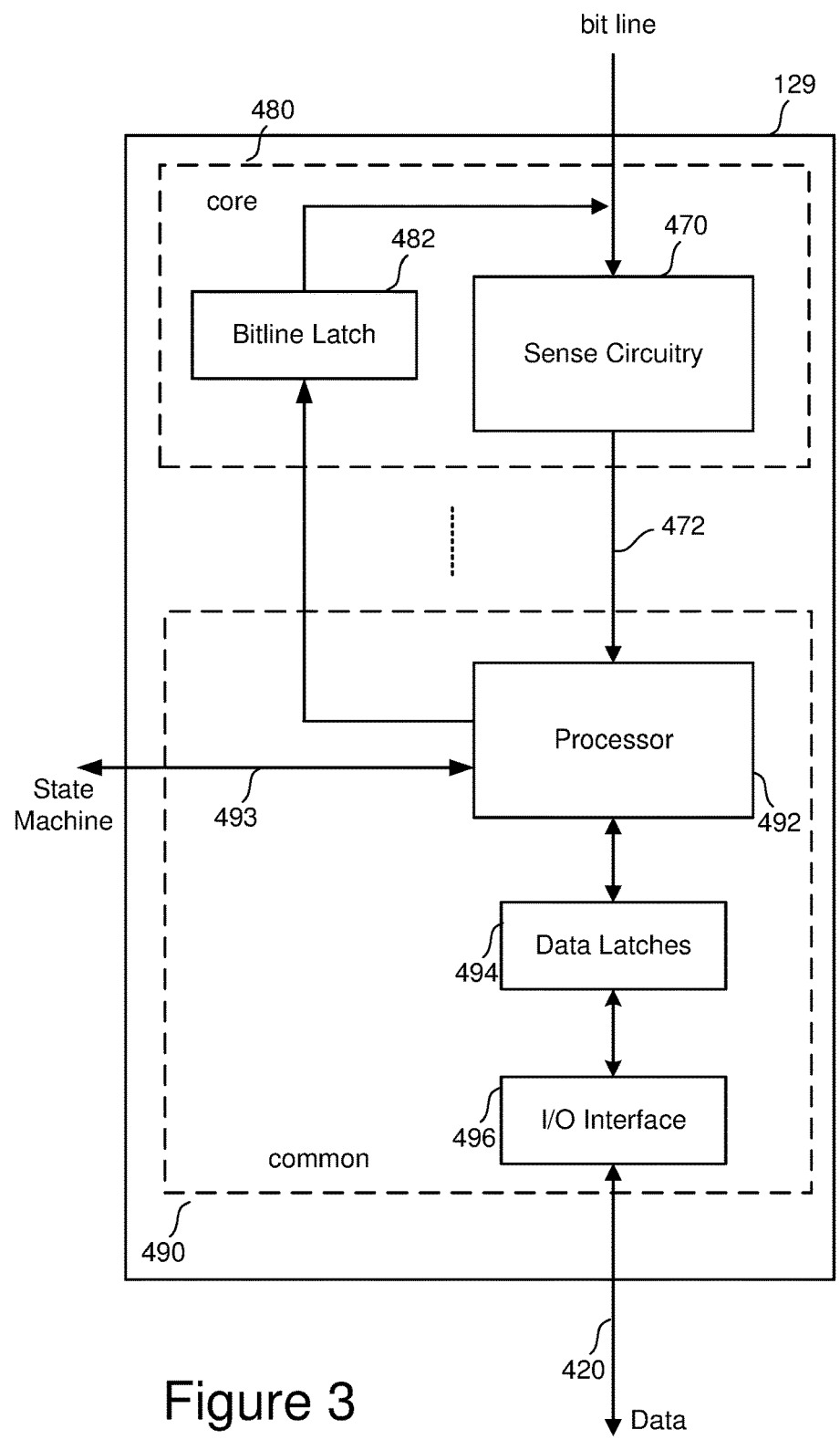
FIG. 3 is a block diagram of an individual sense block.

FIG. 3 is a block diagram of an individual sense block 129 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 112 that controls the supply of different voltages to the addressed memory cell. As it steps through the various predefined voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 3) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments, the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Figure 4:
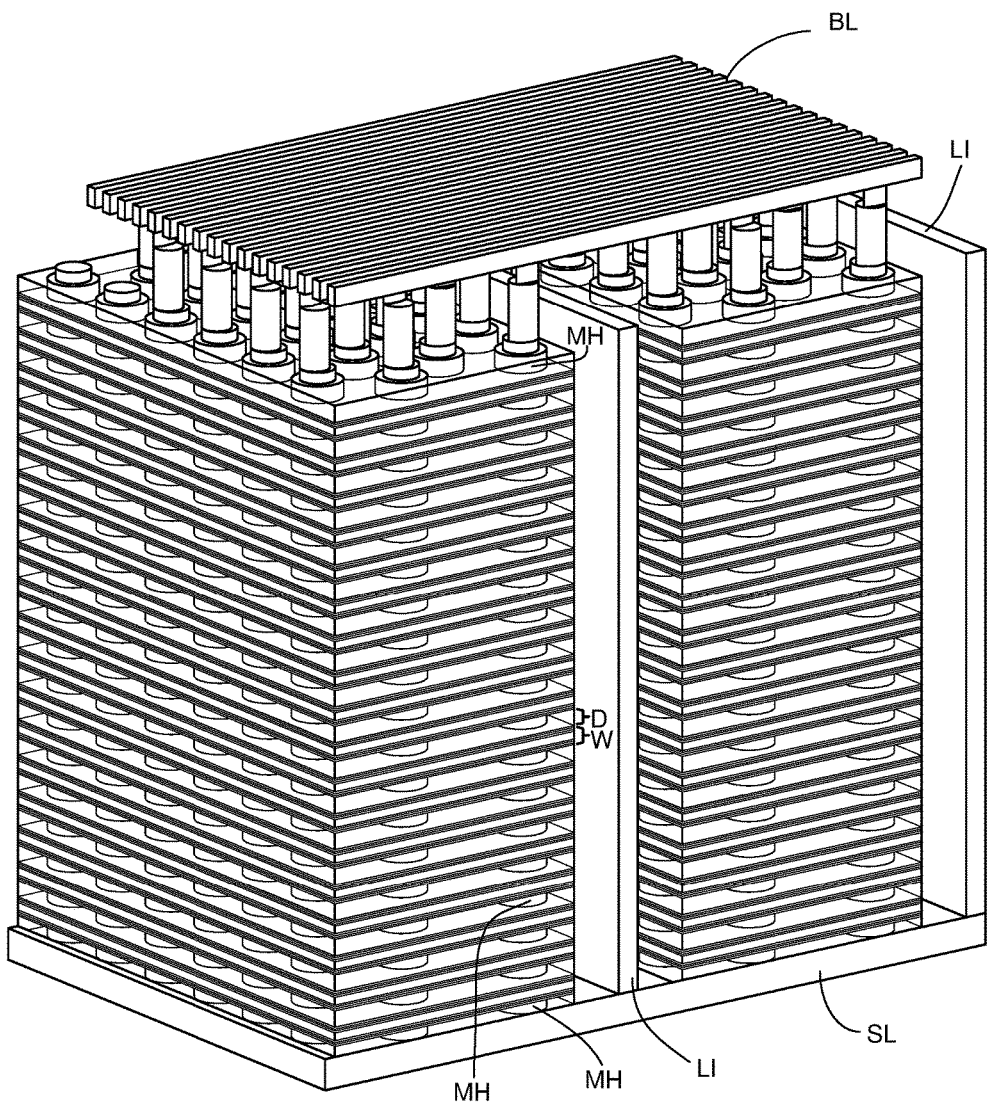
FIG. 4 is a perspective view of a portion of one embodiment of a monolithic three dimensional memory structure.

FIG. 4 is a perspective view of a portion of one example embodiment of a monolithic three dimensional memory structure, which includes a plurality memory cells formed over a common substrate. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "strings" by local interconnects LI. FIG. 4 only shows two strings and two local interconnects LI. In one embodiment, each "string" is a group of vertical NAND strings. In other embodiments, a "string" can be another grouping of serially connected memory cells.

Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data.

Figure 5:
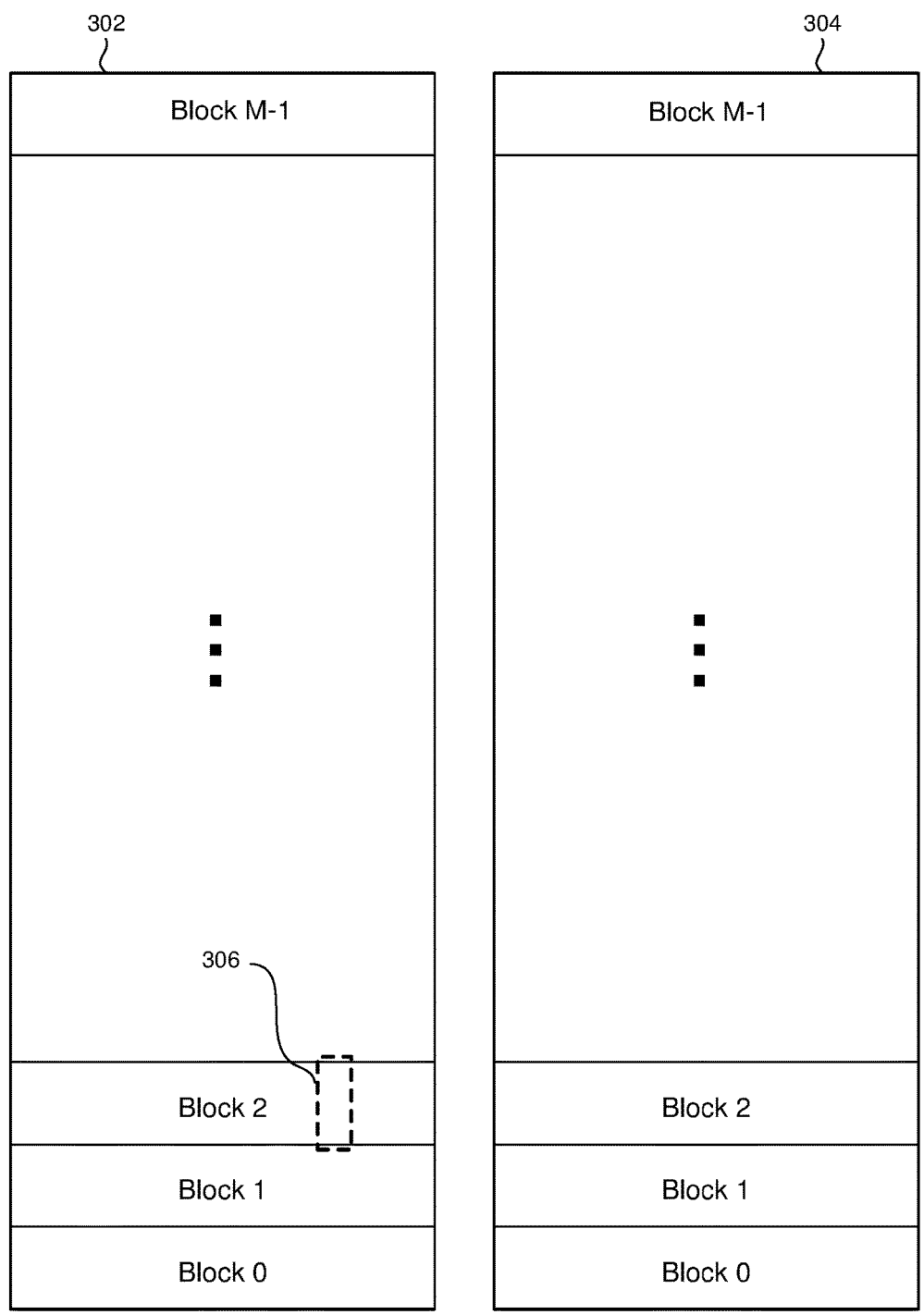
FIG. 5 is a block diagram of a memory structure having two planes.

FIG. 5 is a block diagram explaining one example organization of memory structure 126, which is divided into two planes 302 and 304. Each plane is then divided into M blocks, such as illustrated at 306. In one example, each plane has about 2000 blocks. However, different numbers of blocks and planes can also be used.

Figure 6:
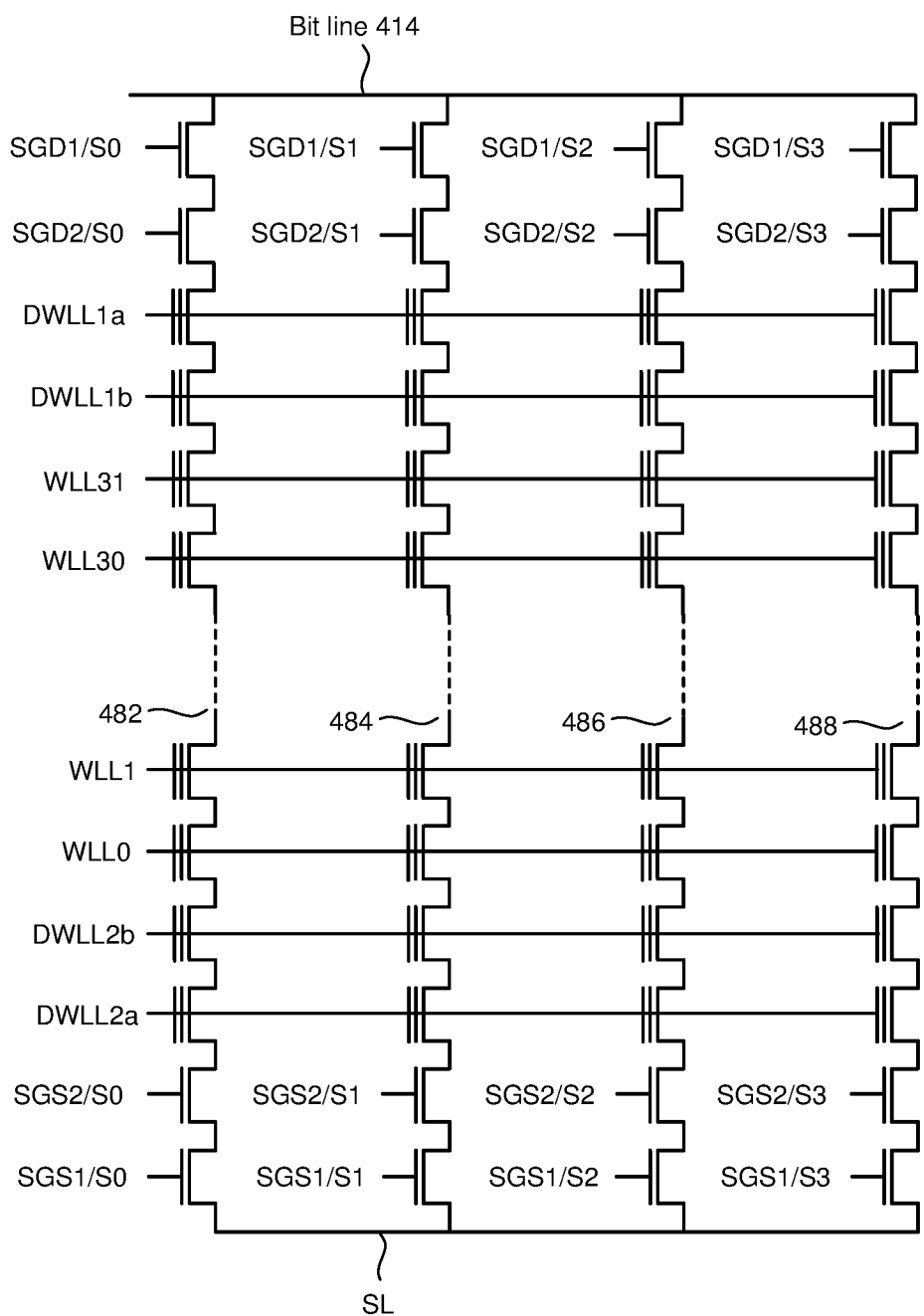
FIG. 6 is a schematic of a plurality of NAND strings.

FIG. 6 is a circuit diagram depicting a plurality of groups of connected programmable and erasable non-volatile memory cells arranged as four NAND strings connected to bit line 414 and common source line SL. The select lines SGD1/S0, SGD1/S1, SGD1/S2, SGD1/S3, SGD2/S0, SGD2/S1, SGD2/S2, SGD2/S3, SGS1/S0, SGS1/S1, SGS1/S2, SGS1/S3, SGS2/S0, SGS2/S1, SGS2/S2, and SGS2/S3 are used to select/unselect the depicted NAND strings. In one embodiment, there are two select lines (and, therefore, two select gates) on each side of each NAND string. Other embodiments can use more than two select lines (and two select gates) on each side or less than two select lines (and two select gates) on each side of the NAND strings. In the embodiment depicted in FIG. 6, to connect a NAND string to the bit line both select gates must be actuated (via the two respective select lines) and to connect a NAND string to the common source line SL both select gates must be actuated (via the two respective select lines). The NAND structure can be implemented in both 3D embodiments, such as shown in FIG. 4, or planar, 2D embodiments.

Figure 7:
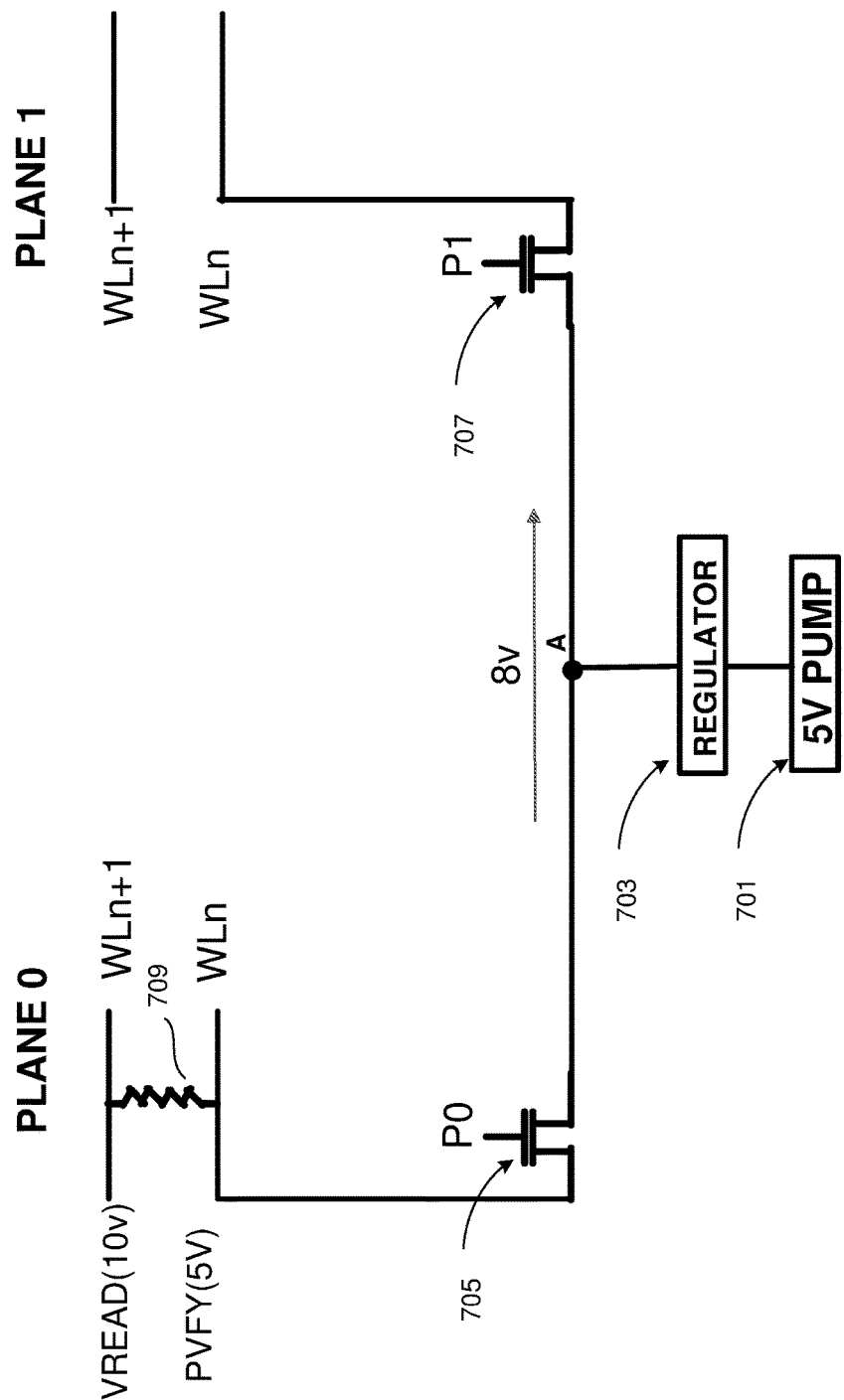
FIG. 7 illustrate an example of an inter-plane disturb.

Returning now to the subject of inter-plane disturb briefly discussed at the start of this section, the idea of inter-plane disturb can be illustrated in more detail with respect to FIG. 7, which shows some of the relevant elements from earlier figures in a simplified form. This particular example looks at a dual plane example, such as illustrated above with respect to FIG. 5, where program verify operations are being performed concurrently. In the program verify operation, selected word lines (WLn in both planes) are supplied with the program verify voltage (PVFY) of, for example, 5 volts. In a NAND type architecture, the other word lines, including the neighboring word line WLn+1, are supplied with a read pass voltage VREAD that is sufficient to turn on the non-selected transistors of the NAND strings of, for example, 10V. The various biasing circuitry, drivers, decoding circuits and the like, are here simplified to a voltage supply of a charge pump 701 and regulator 703 that generates and supplies the PVFY level to a common node A. The voltage level on node A is then supplied to WLn of plane 0 through the switch P0 705 and to WLn of plane 1 through P1 707.

During the program verify operation, WLn of each group of memory cells is supplied by the regulated PVFY level of, here, 5V, while the biasing circuitry will set the neighboring WLn+1 in each array to the higher VREAD. In the case of a defect, such as word line to word line leakage (illustrated schematically at 709) or even a high amount of capacitive coupling, between WLn and WLn+1 in plane 0, WLn may get pulled up (increased) to, say 8V. This elevated voltage will then pass through any intervening decoding circuitry (represented by switch P0 705) to the common node A and then on to WLn of plane 1. Consequently, instead of being at the expected PVFY value, WLn of plane 1 is also elevated, causing an inter-plane disturb by throwing off its read values as well.

Figure 8:
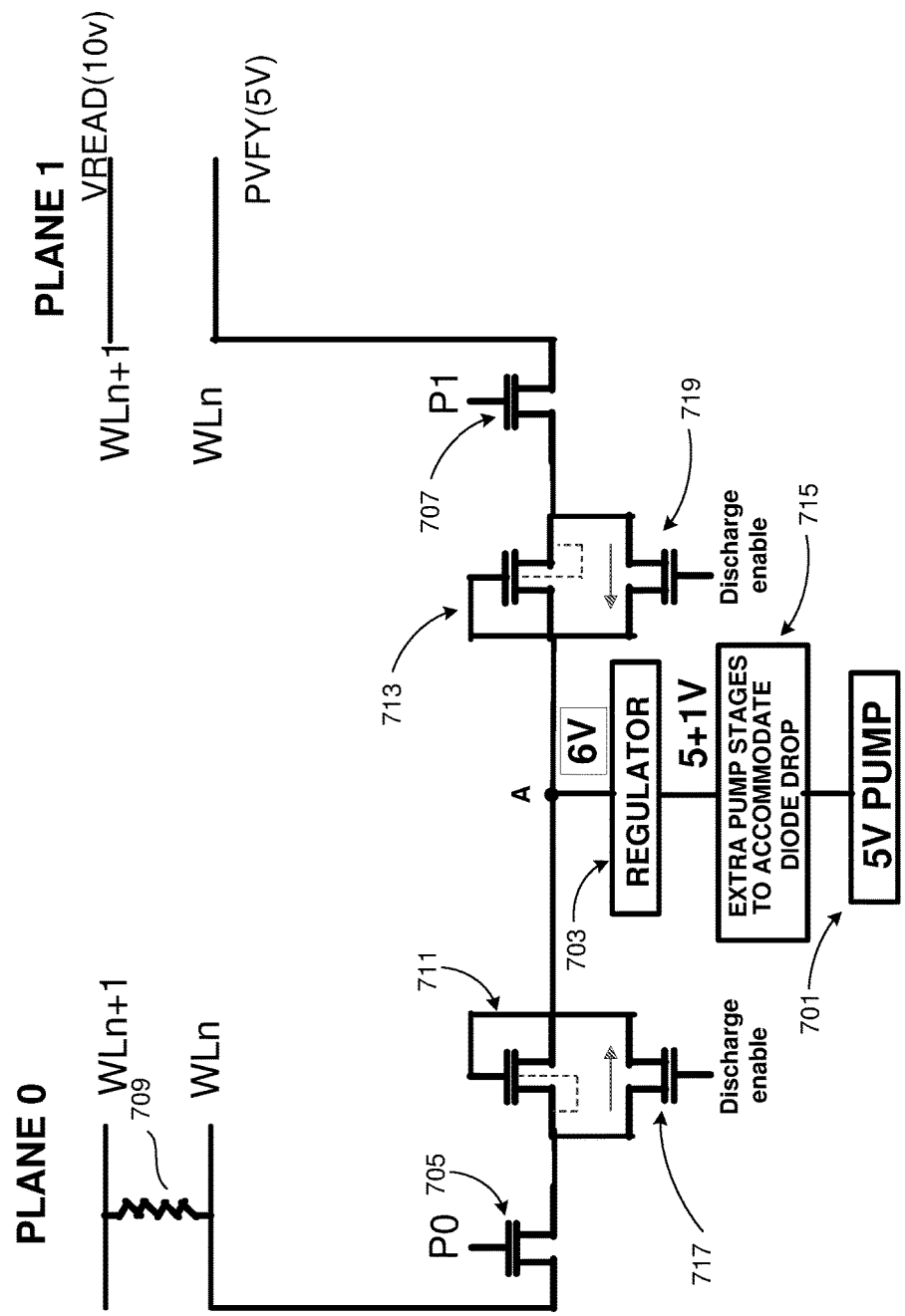
FIG. 8 shows an example of a circuit incorporated elements for preventing inter-plane disturb.

FIG. 8 illustrates techniques for isolating the problem, whether detected or not, to the plane where it is located and avoiding the sort of inter-plane disturb illustrated in FIG. 7. More specifically, one or more uni-directional circuit elements (such as diodes, which are here implemented as diode connected transistors) are placed between the common supply node and the individual planes. As shown in FIG. 8, this is implemented by inserting the diode connected transistor 711 between node A and the group of memory cells of plane 0, and the diode connected transistor 713 between node A and the group of memory cells of plane 1. In this way, should WLn of plane 0 get pulled up above the supply level, for example, the back flow will be stopped by the diode 711, so that the PVFY level on plane 1 is protected. As some of the voltage at node A will be dropped across the diodes 711 and 713, the regulated voltage at node A can be raised by a corresponding amount, such as by adding in an extra stage at the supply's charge pump, represented by the box 715. In this example, the voltage at node A is now regulated to 6V, to provide an effective PVFY of 5V at the selected word lines after a 1V drop across the diode. To allow for the supply lines after the diodes to be discharged, by-pass switches 717 and 719 can be connected in parallel with respective diodes 711 and 713, allowing for the current to be drained off around the diode when needed. Although illustrated for a dual plane embodiment, the methodology extends to higher number of planes.

The exemplary embodiment here is presented in terms of non-volatile NAND memory, such as described with respect to FIGS. 1-6; however, as the elements of interest here are in the peripheral circuitry, rather than the details of the memory cells, these techniques can be applied more generally to other array topologies and cell technologies that can benefit from the sort of protection. For example, if two (or more) groups of DRAM cells are supplied from a common node, a similar arrangement can be used. Additionally, although the examples use two planes, the techniques readily extend to the case of memory circuits having a larger number of planes (such as four or eight) that can be operated for commonly supplied operations.

With respect to the unidirectional current elements, although the exemplary embodiments use diodes (or, more specifically, diode connected transistors), other embodiments may use actively controlled elements instead of, or in addition to, the diodes. For example, the gates of the elements 711 and 713 can, rather than being diode connected, be connected to receive the output of an op-amp. The − input of the op-amp can be connected on the array side of the transistor (that is, between 705 and 711 for 711 and between 707 and 713 for 713 as these elements are drawn in FIG. 8). The op-amp's + input can be connected to a level corresponding regulated level at node A for the operation involved (for example, set at the PVFY level, perhaps with an offset, in FIG. 8). Although somewhat more complex, this sort of arrangement can help to diminish threshold voltage variations of the unidirectional current element, because the threshold voltage gets divided by the gain factor of the op-amp.

The diode plus switch combination of 711, 717 and 713, 719 facilitates the flow of voltages only in the desired direction, avoiding the sort of inter-plane disturb illustrated with respect to FIG. 7. Note that this arrangement will isolate the effects of the disturb to the plane where it originates, whether or not the defect has been detected. Depending on the embodiment, the diodes can use an isolated P-well, providing an isolated section of the substrate separate from that of the other devices' substrate. In case the p-n junction at the source side of the diode configured MOSFET 711 or 713 breaks down due to the back flow of high voltage, use of the separate P-well helps keep the voltage from getting injected into a substrate shared with other peripheral circuitry and keep the injected voltage localized in the well.

As far as the placement of the diode plus switch elements of 711, 717 and 713, 719, these can be placed variously in the path from the common node to the group of memory cells or other element being supplied, such as close to the common node A near the charge pump or voltage regulator; somewhat in the middle, either before or after the plane select switch; or close to the element being supplied. From the fabrication point of view, there can be advantages to placing these elements in the peripheral circuitry near the common supply node and the supply circuitry, such as the charge pump 701 and regulator 703, rather than closer to the array. Additionally, when a comparator is connected across the diode (as discussed below with respect to FIG. 9), placing the unidirectional elements closer to the common supply node can simplify routing.

Although discussed here in the context of a disturb of the PVFY level supplied to selected word lines during a program verify operation, this arrangement can also be applied to other operations and voltage levels in which voltages are concurrently applied to multiple planes from a voltage supply through a common node. In addition to the program verify level applied to selected word lines, these can include: the voltages applied to selected word lines in read or program operations; the voltages applied to non-selected word lines in read, program, or program verify operations; the voltages applied during erase and erase verify operations; and the voltage applied to drain or source select gates, among others. For any of these cases, the presented techniques will isolate the effects to the single plane, whether or not the defect has been detected and independently of the defect's cause, including causes such as excessive capacitive coupling as well as actual leakage.

The circuit presented in FIG. 8 prevents neighbor plane disturb by isolation, but it does not have a way to inform the controller of a memory system that such a possible defect has occurred so that the controller could change the memory system's behavior. Also, as the state of the circuit goes away when the voltage is removed, the system cannot subsequently detect that the possible disturb took place. The circuit's functionality can be enhanced to determine whether a possible disturb has occurred, and for the plane in which it occurred. Based on tripping of a detector mechanism, a status can be updated to indicate to the system that there is likely a defect and that there was potentially a program or other corresponding issue on a plane. The controller could go on to take error correction operations, such as mapping out the defective elements or other defect management, or discontinue multi-plane operations for the offending plane.

Figure 9:
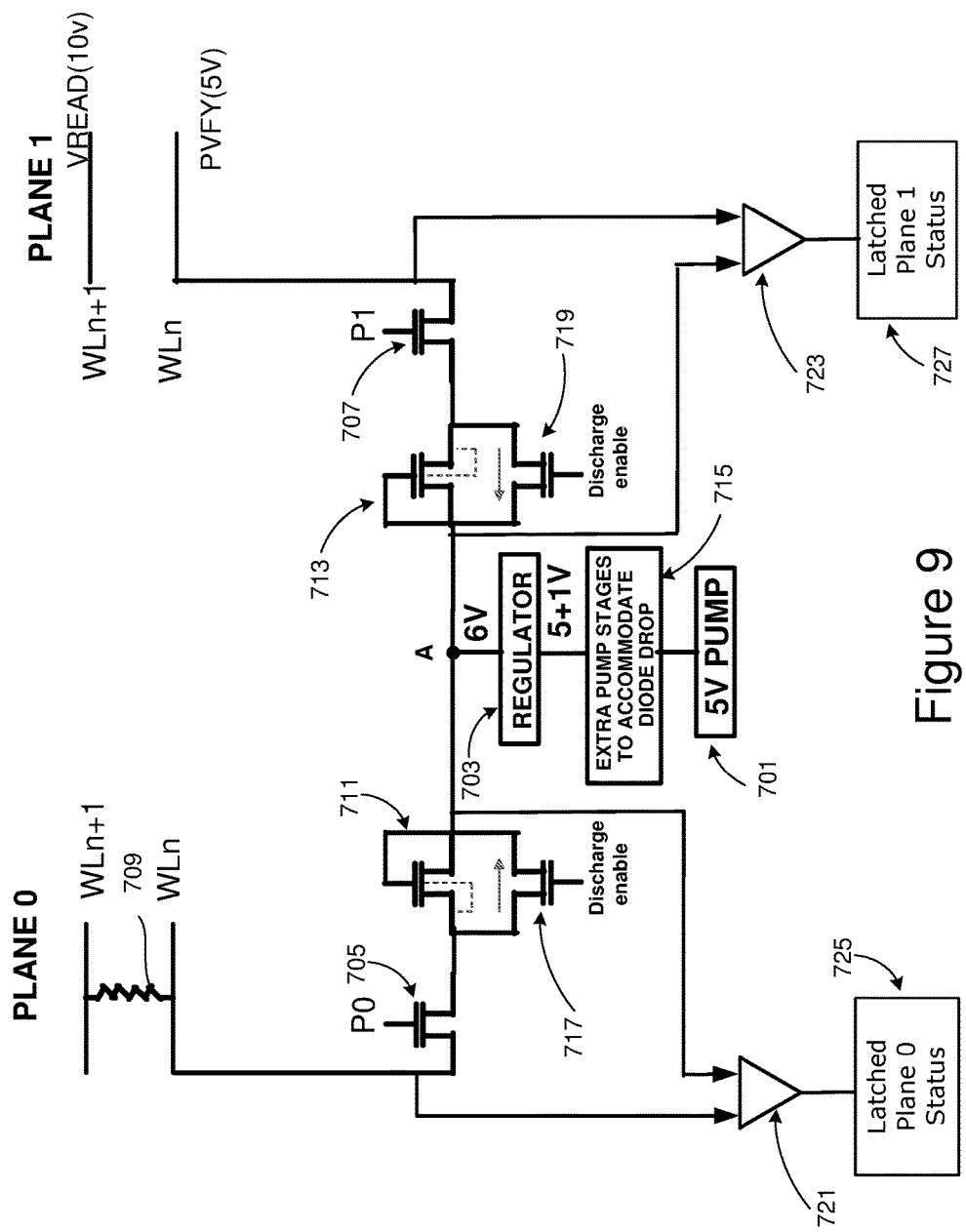
FIG. 9 adds detection capability to the example of FIG. 8.

FIG. 9 presents an embodiment using a comparator and latch circuit to hold a plane related status, which the controller than use along with logic to, for example, support single plane operation or other defect management. Relative to FIG. 8, FIG. 9 adds a comparator (721, 723) connected across the uni-directional circuit element (711, 713) of each plane. The one input is connected to the level at node A, which is the desired level, and the other input is connected to reflect the voltage on the word line (or other supplied element). After accounting for any voltage drops across intervening elements and allowing for some margin of offset, these two values of the two inputs should be more or less the same. The simplified diagram of FIG. 9 does not show any additional elements for these drops or margining; however the diodes 711 and 713 will introduce an offset by themselves so that in FIG. 9 the output of each of the comparators 721 and 723 would trip if the voltage on the selected word line is pulled up by more than, say, one volt, from 5V to above 6V.

For each of the planes the status can then be latched at 725 or 727, as appropriate where it can be accessed by the controller. This creates a way to inform the logic that the comparator circuit tripped independently for each plan and to change to single plane program/verify mid algorithm, which should be safer for both planes if one has an issue. Additionally, it will inform the controller/system that there was an issue by status, so that the system can manage the defect.

Figure 10:
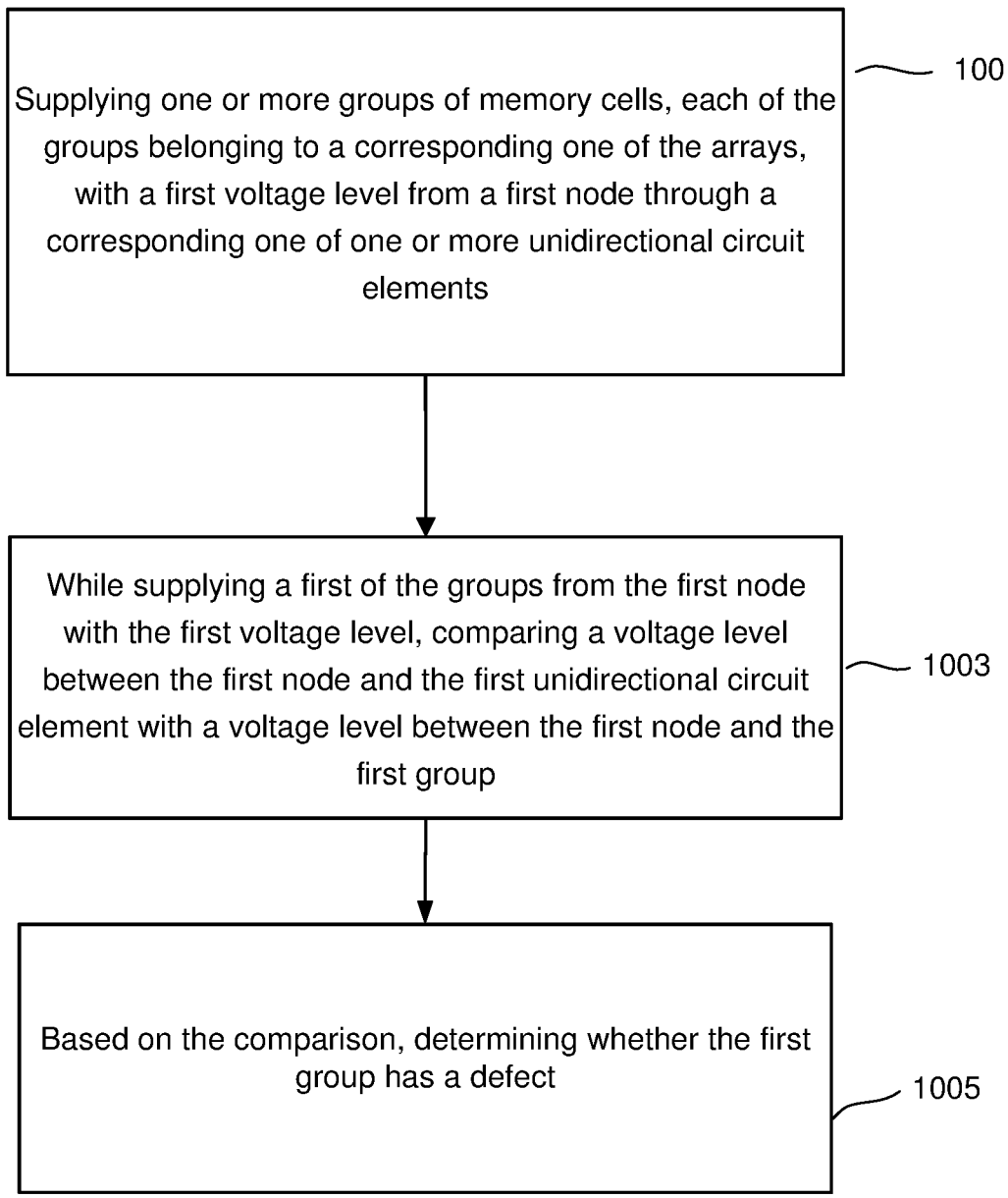
FIG. 10 illustrates the use of a circuit such as that shown in FIG. 9.

FIG. 10 is a flow to illustrate some aspects of the process. Starting at step 1001, one or more groups of memory cells, such as the selected word lines WLn in FIGS. 7-9, from the different arrays are supplied with a voltage from a common node through a corresponding unidirectional circuit elements, as from node A through the diode 711 or 713 in FIG. 9. While one of the groups of cells, such as WLn in plane 0, at step 1003 a comparison is made between the voltage level on the one side of the diode with the voltage level on the other side of the diode. This allows the voltage being supplied to the element to be compared with the voltage actually on the element. Based on the comparison, the output of the comparator provides a determination of whether the first group has a defect at step 1005. If the value latched at step 1005 indicates the output of the comparator has tripped, the controller can then discontinue concurrent multi-plane operation for the determined elements or take other or additional corrective actions.

Consequently, the sort of arrangement illustrated by FIG. 9 provides a circuit to record that a plane defect has been detected. The controller can then change in the behavior of the memory from dual plane to single plane program/verify or other operation in the middle of a dual plane operation. Converting from a dual plane operation to two single plane operations in the middle of an algorithm can help to minimize the impact of such defects. Additionally, this will record the status to highlight that this defect detection has happened, so that the system can respond by mapping out the defect or taking other corrective action.

One embodiment includes an apparatus having first and second groups of memory cells. A voltage supply is connected to a node to supply a first voltage level to both of the first and second groups of memory cells. A control circuit is connected to the first and second groups and to the voltage supply, where the control circuit is configured to perform one or more memory operations concurrently on the first group and the second group such that both the first group and the second group concurrently receive the first voltage level from the node. A first unidirectional circuit element is connected between the first group and the node, and a second unidirectional circuit element is connected between the second group and the node.

In one exemplary embodiment, an apparatus includes a plurality of planes of memory cells, a driver circuit connected to supply a first voltage level to a node, and decoding circuits. Each of the planes is connected to the node through a corresponding decoding circuit. The decoding circuit for each of the planes is connected to the node through a corresponding one of a plurality diodes. A control circuit is connected to the planes, the driver circuit, and the decoding circuits. The control circuit is configured to perform one or more memory operations concurrently on multiple ones of the planes such that decoding circuitry of each of the multiple ones of the planes concurrently receive the first voltage through the corresponding diode.

Other exemplary embodiments present an apparatus that includes a voltage supply for providing a first voltage level and a plurality of groups of memory cells. Biasing means is connected to the plurality of groups and to the voltage supply for concurrently supplying the first voltage level from a common node to multiple ones of the groups while performing a memory operation. The biasing means includes a first plurality of circuit means, through each of which a corresponding one of the groups is connected to receive the first voltage level from the common node, for preventing current from flowing from the corresponding group to the common node during the memory operation.

In various embodiments, a biasing means for supplying the first voltage level can include a charge pump 701 (which may include the additional charge pump stages 715) or a voltage regulator 703. The biasing means can also include the read/write circuits 128, sense blocks 129, or power control module 116 and various biasing circuitry, drivers, and decoding circuits within these elements. Various combinations of these combinations or other circuit elements can also be used. Other embodiments may include similar or equivalent biasing means for supplying the first voltage level.

In various embodiments, a circuit means for preventing current from flowing from a group of memory cells to the common node during a memory operation can include a diode or a diode connected transistor (711, 713). In other embodiments, actively controller transistors can be used, combinations of these, or other circuit elements. Other embodiments may include combinations of these elements or similar or equivalent means for preventing current from flowing cells to the common node.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a first group of memory cells connected to a first word line;
   a second group of memory cells connected to a second word line, the second word line different than the first word line;
   a voltage supply connected to a node to supply a first voltage level to both of the first word line and the second word line;
   a control circuit connected to the first and second groups and to the voltage supply, the control circuit configured to perform one or more memory operations concurrently on the first group and the second group such that both the first word line and the second word line concurrently receive the first voltage level from the node; and
   a first unidirectional circuit element through which the first word line is directly connected to the node when receiving the first voltage level, the first unidirectional circuit element configured to allow current to flow from the node to the first word line and to prevent current from flowing from the first word line to the second word line; and
   a second unidirectional circuit element through which the second word line is directly connected to the node when receiving the first voltage level, the second unidirectional circuit element configured to allow current to flow from the node to the second word line and to prevent current from flowing from the second word line to the first word line.

2. The apparatus of claim 1, further comprising:
   a first by-pass switch connected in parallel with the first unidirectional circuit element between the first word line and the node; and
   a second by-pass switch connected in parallel with the second unidirectional circuit element between the second word line and the node.

3. The apparatus of claim 1, further comprising:
   decoding circuitry connected to the control circuit, including a first decoding circuit connected between the node and the first word line and a second decoding circuit connected between the node and the second word line, whereby the control circuit is configured to supply the first word line and second word line with the first voltage level from the node, and
   wherein the first unidirectional circuit element is connected between the first decoding circuit and the node and the second unidirectional circuit element is connected between the second decoding circuit and the node.

4. The apparatus of claim 1, wherein the voltage supply includes a charge pump.

5. The apparatus of claim 4, wherein the charge pump comprises a plurality of stages, including a stage providing an increase in voltage corresponding to a voltage drop across the unidirectional circuit elements.

6. The apparatus of claim 1, wherein:
   the first group of memory cells are part of a first memory array and second group of memory cells are part of a second memory array, the first memory array and the second memory array formed on a common substrate.

7. The apparatus of claim 6, the common substrate comprising the first unidirectional circuit element and the second unidirectional circuit element, each unidirectional circuit element formed in an isolated well.

8. The apparatus of claim 6, wherein the memory operations performed concurrently on the first and second groups of memory cells comprise a read operation that applies the first voltage level to the first word line and the second word line.

9. The apparatus of claim 6, wherein the memory operations performed concurrently on the first and second groups of memory cells comprise a program verify operation that applies the first voltage level to the first word line and the second word line.

10. The apparatus of claim 6, wherein the memory operations performed concurrently on the first and second groups of memory cells comprise a program operation that applies the first voltage level to the first word line and the second word line.

11. The apparatus of claim 6, wherein the memory operations performed concurrently on the first and second groups of memory cells comprise an erase operation that applies the first voltage level to the first word line and the second word line.

12. The apparatus of claim 1, wherein the first unidirectional circuit element and the second unidirectional circuit element are respectively a first diode and a second diode.

13. The apparatus of claim 12, wherein the first diode and the second diode are respectively implemented as a first diode connected transistor and a second diode connected transistor.

14. The apparatus of claim 1, wherein the first and second groups of memory cells are part of a monolithic three-dimensional semiconductor memory device where the memory cells are arranged in multiple physical levels above a silicon substrate and comprise a charge storage medium.

15. An apparatus, comprising:
    a first group of memory cells;
    a second group of memory cells;
    a voltage supply connected to a node to supply a first voltage level to both of the first and second groups of memory cells;
    a control circuit connected to the first and second groups and to the voltage supply, the control circuit configured to perform one or more memory operations concurrently on the first group and the second group such that both the first group and the second group concurrently receive the first voltage level from the node;

a first unidirectional circuit element connected between the first group and the node, and a second unidirectional circuit element connected between the second group and the node;

a first comparator having a first input connected between the node and the first unidirectional circuit element, a second input connected between the first unidirectional circuit element and the first group of memory cells, and an output based on a voltage level at the second input relative to a voltage level at the first input; and a second comparator having a first input connected between the node and the second unidirectional circuit element, a second input connected between the second unidirectional circuit element and the first group of memory cells, and an output based on a voltage level at the second input relative to a voltage level at the first input put, wherein the control circuit is configured to receive the outputs of the first and second comparators.

16. The apparatus of claim 15, wherein, in response to the output of one or both of the first comparator or the second comparator indicating a defect, the control circuit is subsequently configured to no longer perform memory operations concurrently on the first group of memory cells and the second group of memory cells.

17. The apparatus of claim 15, wherein, in response to the output of the first comparator indicating a defect the control circuit is configured to perform an error correction operation on the first group of memory cells, and in response to the output of the second comparator indicating a defect the control circuit is configured to perform an error correction operation on the second group of memory cells.

18. The apparatus of claim 15, further comprising:
a first by-pass switch connected in parallel with the first unidirectional circuit element between the first group of memory cells and the node; and
a second by-pass switch connected in parallel with the second unidirectional circuit element between the second group of memory cells and the node.

19. The apparatus of claim 15, further comprising:
decoding circuitry connected to the control circuit, including a first decoding circuit connected between the node and the first group of memory cells and a second decoding circuit connected between the node and the second group, whereby the control circuit is configured to supply selected elements of the first and second groups of memory cells with the first voltage level from the node, and
wherein the first unidirectional circuit element is connected between the first decoding circuit and the node and the second unidirectional circuit element is connected between the second decoding circuit and the node.

20. The apparatus of claim 15, wherein the first and second groups of memory cells are part of a monolithic three-dimensional semiconductor memory device where the memory cells are arranged in multiple physical levels above a silicon substrate and comprise a charge storage medium.

* * * * *